US010866269B2

(12) United States Patent
Kumar et al.

(10) Patent No.: US 10,866,269 B2
(45) Date of Patent: Dec. 15, 2020

(54) FAST FREQUENCY CALCULATOR

(71) Applicant: Microchip Technology Incorporated, Chandler, AZ (US)

(72) Inventors: Ajay Kumar, Phoenix, AZ (US); James E. Bartling, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 104 days.

(21) Appl. No.: 16/185,037

(22) Filed: Nov. 9, 2018

(65) Prior Publication Data

US 2019/0146017 A1 May 16, 2019

Related U.S. Application Data

(60) Provisional application No. 62/587,174, filed on Nov. 16, 2017.

(51) Int. Cl.
*G01R 23/02* (2006.01)
*H02J 7/00* (2006.01)
(Continued)

(52) U.S. Cl.
CPC ............ *G01R 23/02* (2013.01); *H02J 7/0068* (2013.01); *G01R 23/12* (2013.01); *H02J 7/345* (2013.01)

(58) Field of Classification Search
CPC .. H02J 7/025; H02J 5/005; H02J 50/10; H02J 7/045; H02J 7/0027; H02J 7/0029; H02J 7/0047; H02J 7/345; H02J 7/0068; G06F 1/16; H04L 9/3278; H04L 27/227; H04L 27/2272; H03F 1/56; H03F 1/565; H03F 2200/387; H03F 3/24; G01R 23/02; G01R 23/12; G01R 31/371; G01R 31/3842; G01R 31/396; H01M 10/48; H03B 2200/0074; H03B 5/1212; H03B 5/1228; H03B 5/124; H03D 5/00; H03D 3/00; H03L 7/085; H03L 7/099; H03L 7/07; H03L 7/18; H04Q 2209/845; H03K 9/06; H03K 5/26; G08B 21/00; H04B 1/7183

See application file for complete search history.

(56) References Cited

U.S. PATENT DOCUMENTS 3,936,674 A 2/1976 Hughes .......................... 327/93
5,926,042 A 7/1999 Talaga, Jr. ..................... 327/45
(Continued)

OTHER PUBLICATIONS

Xu, Zule et al., "Picosecond Resolution Time-to-Digital Converter Using $G_m$-C Integrator and SAR-ADC," IEEE Transactions on Nuclear Science, vol. 61, No. 2, pp. 852-859, Apr. 1, 2014.
(Continued)

*Primary Examiner* — Vinh P Nguyen
(74) *Attorney, Agent, or Firm* — Slayden Grubert Beard PLLC

(57) ABSTRACT

An apparatus includes a capacitor, a reference voltage, an input signal to be measured, and a frequency calculation circuit. The frequency calculation circuit is configured to select a capacitance value for the capacitor, charge the capacitor with the reference voltage, discharge the capacitor to a threshold voltage, and, based on a comparison of time to discharge the capacitor to the threshold voltage with a clock cycle of the input signal, determine a frequency of the input signal.

20 Claims, 4 Drawing Sheets

(51) Int. Cl.
*H02J 7/34* (2006.01)
*G01R 23/12* (2006.01)

(56) References Cited

U.S. PATENT DOCUMENTS

| | | | |
|---|---|---|---|
| 6,043,749 A | 3/2000 | Saito et al. .................... | 340/658 |
| 8,981,973 B2* | 3/2015 | Kumar ................ | H03M 1/0617 |
| | | | 341/118 |
| 9,287,891 B1* | 3/2016 | Lee ..................... | H03M 1/0641 |
| 10,551,428 B2* | 2/2020 | Kumar ............... | G01R 31/2837 |
| 2010/0052732 A1 | 3/2010 | Tokano .......................... | 327/47 |

OTHER PUBLICATIONS

International Search Report and Written Opinion, Application No. PCT/US2018/061187, 15 pages, dated Feb. 28, 2019.

* cited by examiner

FAST FREQUENCY CALCULATOR

RELATED APPLICATIONS

This application claims priority to U.S. Provisional Patent Application No. 62/587,174 filed Nov. 16, 2017, the contents of which are hereby incorporated in their entirety.

FIELD OF THE INVENTION

The present disclosure relates to clock frequency calculation circuits and, more particularly, to a fast frequency calculator and qualifier for an electronic device.

BACKGROUND

An electronic oscillator generally includes a resonant circuit that produces a periodic, time-varying electrical signal of a given frequency. The inverse of the resonant circuit's period determines its frequency. The electrical signal may be used, for instance, to keep track of the passage of time by counting several signal oscillations. A common electronic oscillator employs a quartz crystal as its resonating element, although other types of piezoelectric materials (e.g., polycrystalline ceramics) may also be used.

Electronic oscillators are used to generate clock signals for lots of electronic devices. Electronic oscillators are an important component of radio frequency (RF) and electronic devices. Often, oscillator circuitry is provided on an electronic device.

In applications such as environmental monitoring, various system or device characteristics may be tracked. These characteristics may include under-voltage or over-voltage monitoring, over-clocking or under-clocking monitoring, swapping of crystals, heating and cooling of a device, power strap cut protection, and dynamic power scrambling. In order to provide over-clocking or under-clocking monitoring, a clock signal may be monitored. The frequency of the clock signal may be measured and monitored.

SUMMARY

Embodiments of the present disclosure may include an apparatus. The apparatus may include a capacitor, a reference voltage, an input signal to be measured, and a frequency calculation circuit. The frequency calculation circuit may be configured to select a capacitance value for the capacitor, charge the capacitor with the reference voltage, discharge the capacitor to a threshold voltage, and, based on a comparison of time to discharge the capacitor to the threshold voltage with a clock cycle of the input signal, determine a frequency of the input signal. In combination with any of the above embodiments, the frequency calculation circuit may be further configured to select a subsequent capacitance value for the capacitor based upon the comparison of time to discharge the capacitor with the clock cycle of the input signal. In combination with any of the above embodiments, the frequency calculation circuit may be further configured to charge the capacitor with the reference voltage after setting the capacitor with the subsequent capacitance value, discharge the capacitor to the threshold voltage after setting the capacitor with the subsequent capacitance value, and determine the frequency of the input signal further based on a comparison of the clock cycle of the input signal with time to discharge the capacitor to the threshold voltage after setting the capacitor with the subsequent capacitance value. In combination with any of the above embodiments, the frequency calculation circuit may be further configured to, until a search threshold is reached, iteratively select and set subsequent capacitance values for the capacitor based upon a previous comparison of time to discharge the capacitor with the clock cycle of the input signal charge and discharge the capacitor after each capacitance value is iteratively selected and set for the capacitor, and compare the clock cycle of the input signal with a given time to discharge the capacitor to the threshold voltage given a subsequent capacitance value. In combination with any of the above embodiments, the frequency calculation circuit may be configured to perform a binary search to iteratively select and set subsequent capacitance values. In combination with any of the above embodiments, the frequency calculation circuit may be configured to determine the frequency of the input signal further based on the comparisons of the clock cycle of the input signal with the given times to discharge the capacitor to the threshold voltage given the subsequent capacitance values. In combination with any of the above embodiments, the apparatus may further include a comparison circuit configured to determine discharge of the capacitor to the threshold voltage by a comparison of an instant voltage of the capacitor while discharging with a divided voltage of the reference voltage. In combination with any of the above embodiments, the frequency calculation circuit may be implemented as a successive approximation register. In combination with any of the above embodiments, the capacitor may be a variable capacitor and the frequency calculation circuit is configured to set the capacitance of the variable capacitor. In combination with any of the above embodiments, the determination of the frequency of the input signal may be based upon an association of the time to discharge the capacitor to the threshold voltage with the capacitance value for the capacitor. In combination with any of the above embodiments, the frequency calculation circuit may be further configured to determine the frequency of the input signal based on an inverse of time to discharge the capacitor to the threshold voltage. In combination with any of the above embodiments, the frequency calculation circuit may be further configured to compare completion of discharging the variable capacitor to the threshold voltage with completion of a clock cycle of the input signal. Based on a determination that the variable capacitor completed discharging to the threshold voltage finished before completion of the clock cycle of the input signal, the frequency calculation circuit may be configured to select a second capacitance value of the variable capacitor, wherein the second capacitance value of the variable capacitor is higher than the first capacitance value. Based on a determination that the variable capacitor completed discharging to the threshold voltage finished after completion of the clock cycle of the input signal, the frequency calculation circuit may be configured to select a second capacitance value of the variable capacitor, wherein the second capacitance value of the variable capacitor is lower than the first capacitance value. The frequency calculation circuit may be configured to determine a frequency of the input signal based upon the second capacitance value.

Embodiments of the present disclosure may include a microcontroller, microprocessor, integrated circuit device, or a system including any of the apparatuses of the above embodiments.

Embodiments of the present disclosure may include a method, including operations by any of the microcontrollers, microprocessors integrated circuit devices, or systems

DETAILED DESCRIPTION

Embodiments of the present disclosure may solve problems presented by other solutions to measuring or calculating frequency. Such other solutions may be fooled by clock pattern manipulation or may require many cycles to determine the frequency of a signal.

Embodiments of the present disclosure includes an apparatus. The apparatus includes a capacitor, a reference voltage, an input signal to be measured, and a frequency calculation circuit. The frequency calculation circuit is configured to select a capacitance value for the capacitor, charge the capacitor with the reference voltage, discharge the capacitor to a threshold voltage, and, based on a comparison of time to discharge the capacitor to the threshold voltage with a clock cycle of the input signal, determine a frequency of the input signal. In an embodiment, the frequency calculation circuit is further configured to select a subsequent capacitance value for the capacitor based upon the comparison of time to discharge the capacitor with the clock cycle of the input signal. In an embodiment, the frequency calculation circuit is further configured to charge the capacitor with the reference voltage after setting the capacitor with the subsequent capacitance value, discharge the capacitor to the threshold voltage after setting the capacitor with the subsequent capacitance value, and determine the frequency of the input signal further based on a comparison of the clock cycle of the input signal with time to discharge the capacitor to the threshold voltage after setting the capacitor with the subsequent capacitance value. In an embodiment, the frequency calculation circuit is further configured to, until a search threshold is reached, iteratively select and set subsequent capacitance values for the capacitor based upon a previous comparison of time to discharge the capacitor with the clock cycle of the input signal charge and discharge the capacitor after each capacitance value is iteratively selected and set for the capacitor, and compare the clock cycle of the input signal with a given time to discharge the capacitor to the threshold voltage given a subsequent capacitance value. In an embodiment, the frequency calculation circuit is configured to perform a binary search to iteratively select and set subsequent capacitance values. In an embodiment, the frequency calculation circuit is configured to determine the frequency of the input signal further based on the comparisons of the clock cycle of the input signal with the given times to discharge the capacitor to the threshold voltage given the subsequent capacitance values. In an embodiment, the apparatus further includes a comparison circuit configured to determine discharge of the capacitor to the threshold voltage by a comparison of an instant voltage of the capacitor while discharging with a divided voltage of the reference voltage.

Figure 1:
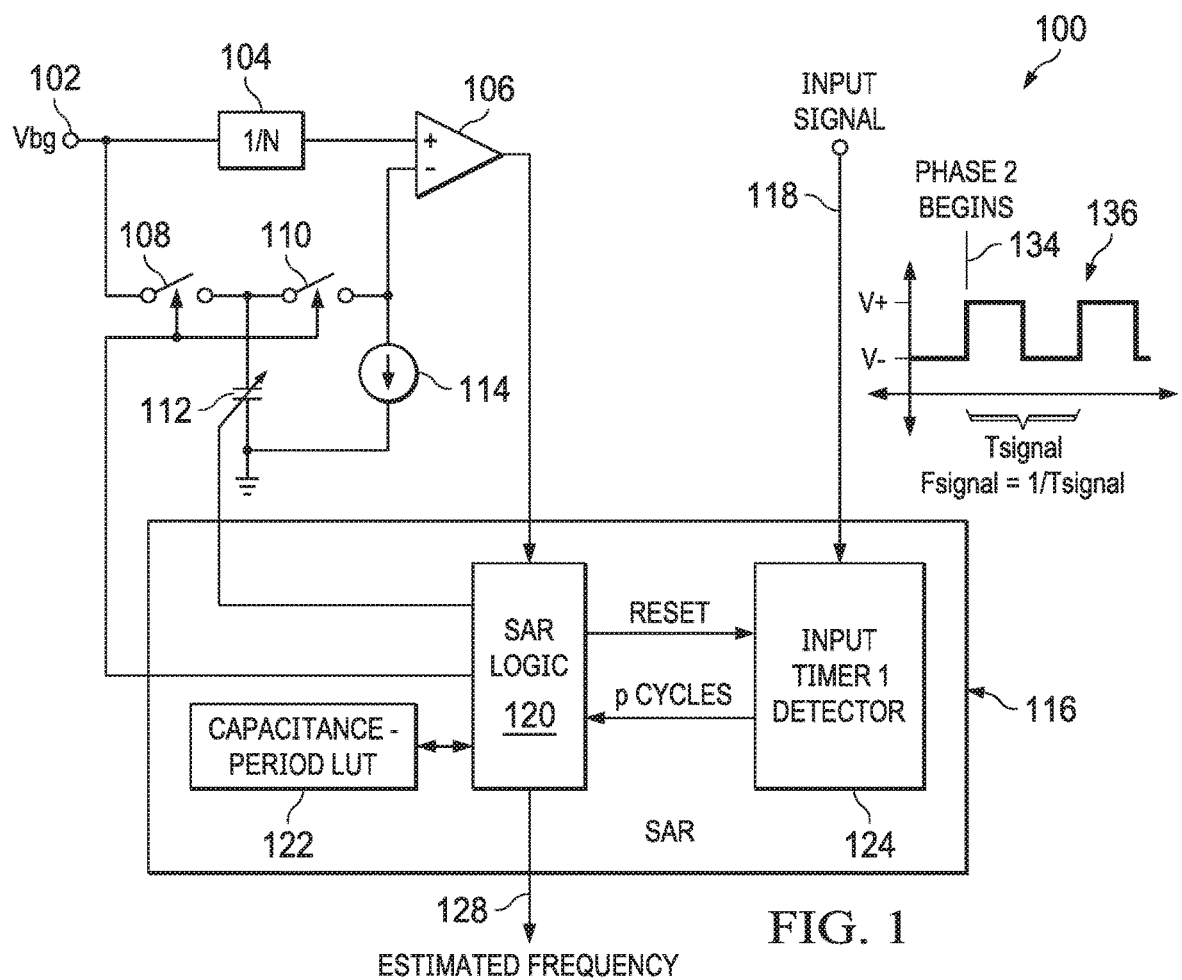
FIG. 1 is an illustration of a frequency calculation circuit, according to embodiments of the present disclosure.

FIG. 1 is an illustration of a frequency calculation circuit 100, according to embodiments of the present disclosure.

Frequency calculation circuit 100 may be configured to determine a frequency of an input signal. Frequency calculation circuit 100 may be used, for example, to perform a fast frequency calculation, as a frequency qualifier, in phase-locked-loop (PLL) applications, in performance monitoring, or in security systems.

Circuit 100 may be configured to measure a frequency of an input signal 118. Frequency calculation circuit 100 may be configured to output a measured or an estimated frequency 128. The frequency calculation may be of any suitable input signal, such as a clock. The clock may be for any suitable electronic device, such as a semiconductor package, microprocessor, microcontrollers, or tamper-detectors. The clock may be a generated, divided, processed, or other clock signal. The clock may arise from, for example, a crystal or other clock or frequency source. The clock may be of any suitable form, such as a square wave, approximate square wave, or other periodic signal. The square wave may be formed from another periodic signal. The square wave may have a variety of duty cycles and periods.

In one embodiment, frequency calculation circuit 100 may be based upon a successive approximation register 116 (SAR) to find the frequency of input signal 118. In another embodiment, frequency calculation circuit 100 may be configured to search and find a value of a capacitor which can be discharged from one known voltage to another known voltage within a finite number of cycles of input signal 118. Such a finite number of cycles of input signal 118 may be given as p. The finite number of cyclesp of input signal 118 may be a single cycle, though more cycles may be used. Frequency calculation circuit 100 may be configured to search for a value of the capacitor for which the time of the known voltage change most closely matches the time required to complete the number of finite cycles of input signal 118.

A subcircuit may include a capacitor charged to a reference voltage value, which is subsequently discharged to a known lower voltage and with a known current discharge value. The capacitance of the capacitor may be selectable. The relationship between these quantities and the time period to achieve the drop in voltage may be given as:

$C*\Delta V = I*\Delta t$ and thus the time period to achieve the known drop in voltage is $$\Delta t = \frac{C*\Delta V}{I} \quad \text{(EQUATION 1)}$$

where Δt is the time period to achieve the drop in voltage, C is the capacitance of the capacitor, ΔV is the change in voltage, and I is the discharge current. Accordingly, for a known capacitance C, change in voltage ΔV, and discharge current I, an expected time Δt needed for the change in voltage may also be known. Frequency calculation circuit 100 may store a quantity of known capacitance values and associated known time values.

SAR 116 may be configured to successively vary the capacitor. In each variation of capacitance values, SAR 116 may be configured to determine whether the defined change in voltage completed before, or after, input signal 118 completed a cycle. If the change in voltage completed when input signal 118 completed a cycle, then the known frequency associated with the capacitance value may equal the frequency of input signal 118. If the change in voltage completed before input signal 118 completed a cycle, the frequency of input signal 118 may be slower than the known frequency associated with the capacitance value. If the change in voltage completed after input signal 118 completed a cycle, the frequency of input signal 118 may be higher than the known frequency associated with the capacitance value. SAR 116 may be configured to subsequently vary the capacitance up or down based upon the results of analyzing the timing of the change in voltage against the time required for a cycle of input signal 118. SAR 116 may vary the capacitance to increase or decrease the time for the predetermined change in voltage. Sar 116 may be configured to perform a subsequent check for the next selected capacitance, wherein the change in voltage is again observed. This process may be repeated. The selection of capacitance values may be selected according to a binary search pattern. A first capacitance value may be a half-way point between a maximum and minimum known capacitance-time pair. A second capacitance value may be a halfway point between the first capacitance value and an appropriate upper or lower limit. The search may be continued until a closest capacitance-time pair is found, a certain number of searches have been made, or any other suitable limit. The final capacitance-time pair may be a measure of the period of input signal 118 and thus the time of the capacitance-time pair may be used as a determination of the period of input signal 118. The estimated frequency 128 may be an inverse of this determined period.

Besides SAR 116, frequency calculation circuit 100 may include a voltage divider 104, a reference voltage 102, a comparator 106, switches 108, 110, a capacitor 112, and a current sink or source 114. SAR 116 may be implemented by analog circuitry, digital circuitry, or any suitable combination thereof to accomplish combinatorial logic. SAR 116 may in turn include or be configured to access a capacitance-period look-up table (LUT) 122, an SAR logic 120, and an input timer/detector 124. SAR logic 120 may be implemented by analog circuitry, digital circuitry, or any suitable combination thereof to accomplish combinatorial logic. SAR logic 120 may be configured to perform control operations of SAR 116 and, in turn, operations of other elements of frequency calculation circuit 100.

Reference voltage 102 may be a fixed or known voltage. In one embodiment, reference voltage 102 may be a bandgap voltage, Vbg, available from a circuit, system, die, microcontroller, or other entity in which frequency calculation circuit 100 is implemented. In one example, reference voltage may be 1.2V, though any suitable voltage may be used.

Voltage divider 104 may be implemented by analog circuitry, digital circuitry, or any suitable combination thereof. For example, voltage divider 104 may be implemented by a resistive network. Voltage divider 104 may be configured to divide reference voltage 102 down to a lower threshold voltage, and to provide the lower threshold voltage to comparator 106. The particular degree to which voltage divider 104 may divide reference voltage 102 may be configurable or selectable. For example, voltage divider 104 may be configured to divide reference voltage 102 by a factor N such that the actual voltage reference provided to the positive input of comparator 106 is 0.2V. In such an example, N may be six.

Comparator 106 may be implemented by analog circuitry, digital circuitry, or any suitable combination thereof. Comparator 106 may be configured to compare the voltage presented on its positive input to a voltage presented on its negative input and send the results to SAR logic 120. For example, when voltage of capacitor 112 (discussed in further detail below) at the negative terminal of comparator 106 is greater than the divided voltage from voltage divider 104 (for example, 0.2V) at the positive terminal of comparator 106, comparator 106 may output a zero or logic low. Upon the voltage of capacitor 112 reaching the divided voltage from voltage divider 104 (in this example, 0.2V) comparator 106 may produce a one or logic high signal. The output result of the comparison may be provided to SAR logic 120. Accordingly, when SAR logic 120 receives a logic high signal or other indication from comparator 106 that the discharge voltage of capacitor 112 has reached the designated threshold at the positive input of comparator 106, SAR logic 120 may be able to identify time elapsed since the beginning of the discharge phase, to be explained further below.

Capacitor 112 may be a variable capacitor. Furthermore, capacitor 112 may be a polarized capacitor. For example, capacitor 112 may be implemented as a voltage tuned or digitally tuned capacitor. The capacitance of capacitor 112 may be controlled by signals from SAR logic 116. Another possible implementation of capacitor 112 is discussed within the context of FIG. 2.

Current sink or source 114 may be configured to drive a specified current from a terminal of comparator 106 to ground, particularly the negative terminal of comparator 106. Current sink or source 114 may be implemented by analog circuitry, digital circuitry, or any suitable combination thereof. Current sink or source 114 may be configured to be switched into operation by a switch (not shown).

SAR logic 120 may be configured to selectively operate switches 108, 110. SAR logic 120 may be configured to selectively operate switches 108, 110 to charge or discharge capacitor 112. Control signals to respective ones of switches 108, 110 may be complements of each other such that when one of switches 108, 110 is open, the other is closed.

In a first, charging phase of operation, SAR logic 120 may be configured to close switch 108 and to open switch 110. In such a first, charging phase, capacitor 112 may be charged to the value of reference voltage 102. During such a first, charging phase, output of comparator 106 may be ignored by SAR logic 120.

In a second, discharging phase of operation, SAR logic 120 may be configured to open switch 108 and to close switch 110. In such a second, discharging phase, the charge of capacitor 112 may be provided to the negative terminal of comparator 106. In such a second, discharging phase, the charge may be discharged according to a current set by current sink or source 114.

During such a second, discharging phase of operation, reference voltage 102, as divided by voltage divider 104, may be continually compared to the discharging voltage of capacitor 112. The voltage of capacitor 112, as seen at the negative terminal of comparator 106, falls as capacitor 112 discharges. The result of the comparison may be provided to SAR logic 120. Upon receiving a logic high or one value from comparator 106 (or the reverse if the inputs are flipped), SAR logic 120 may recognize that the voltage of capacitor 112 has reached the divided reference voltage. In one embodiment, this voltage change from the original value of capacitor 112 to the divided reference voltage may be the known voltage change of EQUATION 1. The time taken to reach this voltage change may be the change in time of EQUATION 1. This change in time is matched to the capacitance value selected for capacitor 112.

Accordingly, in one embodiment the output of comparator 106 showing that the voltage of capacitor 112 has discharged sufficiently to drop to the level of the divided reference voltage may be a timing signal to indicate that the time elapsed from the closing of switch 110 to achieve such a drop in voltage has been reached. This time delay, Δt, set by a particular selection of capacitance values for capacitor 112, may be a measurement technique against which a period of input signal 118 may be measured.

Figure 2:
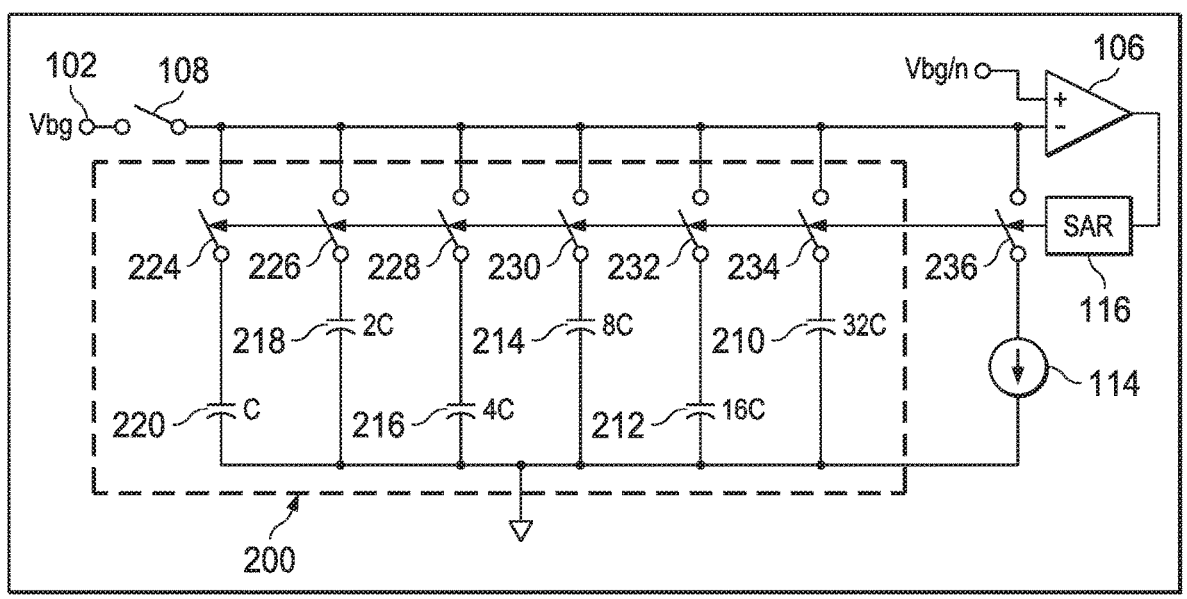
FIG. 2 is a more detailed illustration of portions of a frequency calculation circuit with an implementation of a variable capacitor, according to embodiments of the present disclosure.

FIG. 2 is a more detailed illustration of portions of frequency calculation circuit 100 with an implementation of a variable capacitor 200, according to embodiments of the present disclosure. Variable capacitor 200 may further implement capacitor 112.

Variable capacitor 200 may include one or more capacitors of varying fixed capacitance. SAR 116 may be configured to switch a particular one of such capacitors such that the selected capacitor is connected to other elements of frequency calculation circuit 100.

For example, variable capacitor 200 may include capacitors 210, 212, 214, 216, 218, 220. The values of each of capacitors 210, 212, 214, 216, 218, 220 may be multiples of one another. For example, given a base capacitance value, c, the values of capacitors 210, 212, 214, 216, 218, 220 may be, respectively, 32*c, 16*c, 8*c, 4*c, 2*c, and 1*c. Each such value may be known or predetermined, and associated with an expected time by which a voltage stored in such a capacitor will discharge a known amount.

SAR 116 may be configured to select one or more of the capacitors of variable capacitor 200 by closing or enabling a single one or more than one of switches 224, 226, 228, 230, 232, 234, while leaving the other switches open or disabled. The capacitor of capacitors 210, 212, 214, 216, 218, 220 associated with the closed switch, or switches, of switches 224, 226, 228, 230, 232, 234 may be applied to the rest of frequency calculation circuit 100. Switch 236 may be closed during the second, discharging phase of operation discussed above, and open during the first, charging phase of operation discussed above. In one embodiment, switch 236 may implement switch 110.

To charge a given capacitor, SAR 116 may close switch 108 and close the switch or switches of switches 224, 226, 228, 230, 232, 234 associated with the one or more given capacitors of capacitors 210, 212, 214, 216, 218, 220. The other switches of switches 224, 226, 228, 230, 232, 234 may remain open as well as switch 236. To discharge the one or more given capacitors, SAR 116 may open switch 108, close switch 236, but maintain the already closed switch of switches 224, 226, 228, 230, 232, 234 associated with the given capacitor or capacitors of capacitors 210, 212, 214, 216, 218, 220, and further maintain the already open switches of switches 224, 226, 228, 230, 232, 234. In a next sequence, a different one or more capacitors may be selected.

Variable capacitor 200 may include more or fewer capacitors and of further varying capacitance values.

Furthermore, SAR 116 may be configured to select one or more of the capacitors of variable capacitor 200 by keeping the switches 224, 226, 228, 230, 232, 234 and 108 either on the top plate or bottom plate of capacitors 210-218.

Returning to FIG. 1, to select a given capacitance value, SAR logic 120 may access a particular capacitance-time pair. Various pairs of known capacitances and known times may be stored in frequency calculation circuit 100 in, for example a lookup table (LUT) 122. LUT 122 may be implemented in any suitable manner, such as a table in memory, lookup table, array, cache, or other suitable data structure. If, upon identifying that a given capacitance value is associated with a time period that is too long or too short for a cycle of input signal 118, SAR logic 120 may select a different capacitance value associated with a time period that is, respectively, shorter or longer. SAR logic 120 may select capacitance values from LUT 122 according to any suitable criteria, such as a binary search or other search. For a binary search, SAR logic 120 may begin with a capacitance value from the middle of an ordered sequence of capacitance values in LUT 122. In a second step of such a search, to search for a lower capacitance, SAR logic may select the capacitance at the midpoint of a newly designated range in LUT 122, wherein the previously selected capacitance value is the upper limit and the minimum capacitance is the lower limit. In a second step of such a search, to search for a higher capacitance, SAR logic 120 may select the capacitance at the midpoint of a newly designated range in LUT 122, wherein the previously selected capacitance value is the lower limit and the maximum capacitance is the higher limit. Subsequent steps may repeat this process, substituted previously used capacitances as upper or lower limits as necessary.

As discussed above, SAR logic 120 may use the arrival of a signal from comparator 106 to identify when the voltage of capacitor 122 has sufficiently discharged to reach the divided input voltage. This signal may mark the end of Δt associated with the particular capacitance that was selected for capacitor 112. SAR logic 120 may compare the arrival of this signal from comparator 106 with the termination of a cycle of input signal 118 to determine which finished first, as will be explained below.

SAR 116 may include any suitable mechanism by which the arrival of the signal from comparator 106 (indicating the completed change in voltage of capacitor 112) is compared with completion or termination of a cycle of input signal 118. For example, SAR 116 may include an input timer/detector 124. Input timer/detector 124 may be implemented by any suitable combination of analog or digital circuitry, such as shift registers, flip-flops, or latches. SAR logic 120 may detect, through input timer/detector 124, the start of a cycle of input signal 118 at 134 when input signal 118 first goes high after waiting to observe input signal 118. SAR logic 120 may detect, through input timer/detector 124, the end of the cycle of input signal 118 at 136 when input signal 118 again goes high after going low. SAR logic 120 may use input signal 118, or derivative signals produced therefrom by input timer/detector 124, as an enable or disable for phases of operation. For example, SAR logic 120 may use the start of a cycle on input signal 118 at 134 as an enable for the second, discharging phase of operation. SAR logic 120 may use the end of the cycle of input signal 118 at 136 as an indication of the end of the cycle of input signal 118, which may be compared against the signal received from comparator 106. Furthermore, SAR logic 120 may use the end of the cycle of input signal 118 at 136 as an end or disabling of the second, discharging phase of operation. At such an end or disabling of the second, discharging phase of operation, the value from comparator 106 may be evaluated to determine whether the voltage of capacitor 112 has sufficiently discharged to reach the divided reference voltage and thus reach Δt.

Accordingly, a signal from comparator 106 indicating that the voltage in capacitor 112 has dropped from the known upper voltage to the known lower voltage in the second phase of operation may be represented by Δt in EQUATION 1, where the drop from the known upper voltage to the known lower voltage may be represented by ΔV, the capacitance C may be the capacitance of capacitor 112, which may be known and set by SAR logic 120, and the current I may be the current of current sink or source 114.

At the beginning of the second phase of operation of frequency calculation circuit 100 (at 134 in terms of the cycle of input signal 118), capacitor 112 may be charged to a value of the maximum of reference voltage 102. Reference voltage 102 may be divided by voltage divider 104 by a factor of N and thus be less than the fully charged value of capacitor 112. Accordingly, comparator 106 may detect that capacitor 112 has greater voltage than the divided reference voltage and report the comparison to SAR logic 120 with a logic low or zero. After making continual such comparisons during the discharge of capacitor 112, at some point in time, the voltage at the negative terminal of comparator 106 will drop to a predetermined level. For example, if reference voltage 102, Vbg, is 1.2V and N is six, the divided reference voltage at the positive terminal of comparator 106 may be 0.2V. At the start of the second phase (at 134), the voltage from capacitor 112 may initially be 1.2V. At some point during the second phase during discharge, the voltage from capacitor 112 may drop to, for example 0.2V. When the voltage from capacitor 112 reaches or goes below (depending upon the hysteresis of comparator 106) the divided reference voltage, comparator 106 may issue a logic high or one to SAR logic 120. Before such a point is reached, comparator 106 may continue issue a logic low or zero to SAR logic 120.

Accordingly, at the moment when SAR logic 120 receives a logic high signal or other indication from comparator 106 that the voltage of capacitor 112 has reached the designated threshold set by the divided reference voltage, SAR logic 120 may be able to identify that a time $\Delta t$ has elapsed from the beginning of the second phase of operation of frequency calculation circuit 100. Moreover, SAR logic 120 may be configured to recognize, through receipt of an indication from input timer/detector 124, that the cycle of input signal 118 has ended at 136. SAR logic 120 may be configured to determine which event—i.e., completion of the drop in voltage from comparator 106 or termination of the cycle of input signal 118—occurred first, second, or whether the events happened at the same time.

Figure 3A:
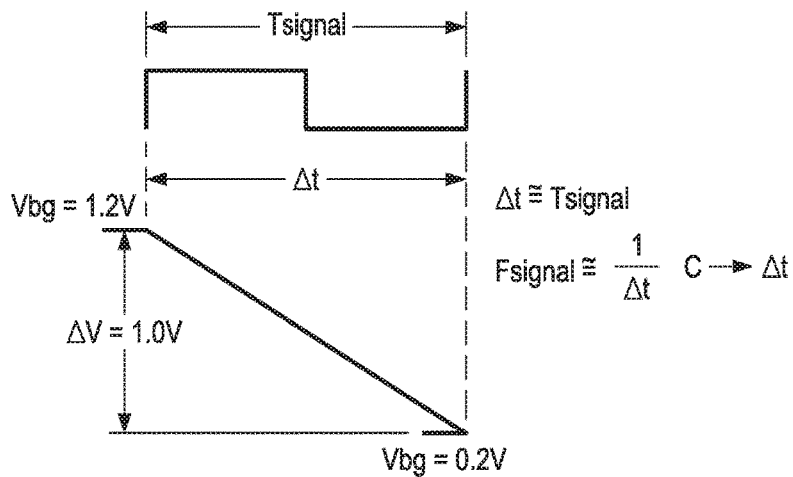
FIGS. 3A, 3B, and 3C are illustrations of comparisons of discharge of a capacitor down to a threshold voltage with a cycle of a signal to be measured, according to embodiments of the present disclosure.
Figure 3B:
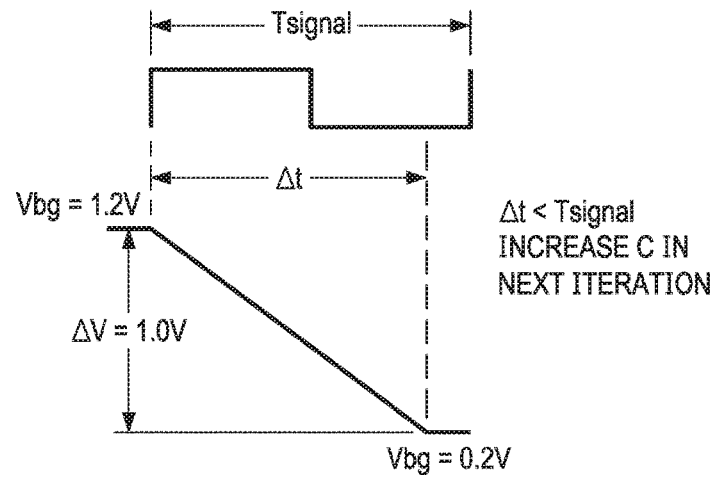
Figure 3C:
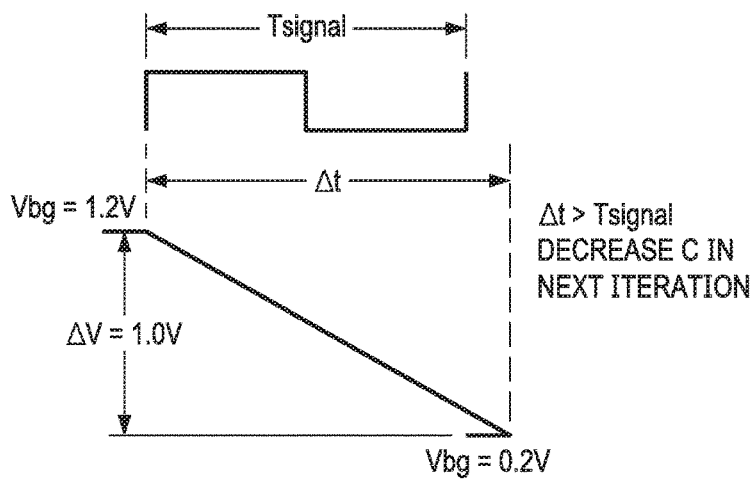

FIGS. 3A-3C are illustrations of operation of frequency calculation 100, according to embodiments of the present disclosure. In particular, FIGS. 3A-3C each represent a relationship between a given known drop in voltage and the length of time $\Delta t$ that was required for such a drop in voltage. Furthermore, a given cycle of input signal 118 is illustrated in each figure. The length of the given cycle of input signal 118 is shown at Tsignal. Selection of the capacitance value C for capacitor 112 affects the length of time $\Delta t$ that was required for the predetermined drop in voltage, $\Delta V$. According to EQUATION 1, an increase in capacitance leads to an increase in $\Delta t$. Each of FIGS. 3A-3C represent a different use case of selection of a value of C for capacitor 112 and the relative lengths of $\Delta t$ and Tsignal.

SAR logic 120 may be configured to perform successive first and second phases of operation with different capacitance values to most closely match $\Delta t$ and Tsignal. This may constitute a search for an optimum or more accurate capacitance value for capacitor 112 that in turn yields a closest value of $\Delta t$ and Tsignal. Upon a defined number of successive searches for capacitance values, or upon a particular error threshold, SAR logic 120 may accept the capacitance value yielding the closest value of $\Delta t$ and Tsignal. SAR logic 120 may output the determined $\Delta t$ or the inverse of $\Delta t$ as estimated or measured frequency 128. Each selection and application of a capacitance value may require a cycle of input signal 118 to measure the cycle of input signal 118. Charging capacitor 112 may take a variable amount of time depending upon the size of capacitance of capacitor 112. Different instances of frequency calculation circuit, or subparts of frequency calculation circuit 100, may be switched together so that different instances of capacitor 112 may be charging while other instances are being measured, thus reducing time to make a sufficient number of searches and comparisons.

In FIG. 3A, a search performed by SAR logic for a given capacitance value for capacitor 112 may yield a result wherein $\Delta t$ and Tsignal may be approximately the same. Thus, the frequency of input signal 118 may be approximately the inverse of $\Delta t$. The capacitance C used to accomplish the search may be used to look up the associated $\Delta t$. The associated $\Delta t$ may be output, or its inverse may be output as estimated or measured frequency 128.

In FIG. 3B, a search performed by SAR logic 120 for a given capacitance value for capacitor 112 may yield a result wherein $\Delta t$ is less than Tsignal. The end of the cycle of input signal 118 may have been detected after comparator 106 reported that the designated change in voltage $\Delta V$ had occurred. In a subsequent search, an increased value of C for capacitor 112 may be selected for the next iteration.

If a sufficient number of searches have been performed, or if error is low enough, the frequency of input signal 118 may be considered to be approximately the inverse of $\Delta t$. The capacitance C used to accomplish the search may be used to look up the associated $\Delta t$. The associated $\Delta t$ may be output, or its inverse may be output as estimated or measured frequency 128.

In FIG. 3C, a search performed by SAR logic 120 for a given capacitance value for capacitor 112 may yield a result wherein $\Delta t$ is greater than Tsignal. The end of the cycle of input signal 118 may have been detected before comparator 106 reported that the designated change in voltage $\Delta V$ had occurred. In a subsequent search, a decreased value of C for capacitor 112 may be selected for the next iteration.

If a sufficient number of searches have been performed, or if error is low enough, the frequency of input signal 118 may be considered to be approximately the inverse of $\Delta t$. The capacitance C used to accomplish the search may be used to look up the associated $\Delta t$. The associated $\Delta t$ may be output, or its inverse may be output as estimated or measured frequency 128.

Figure 4:
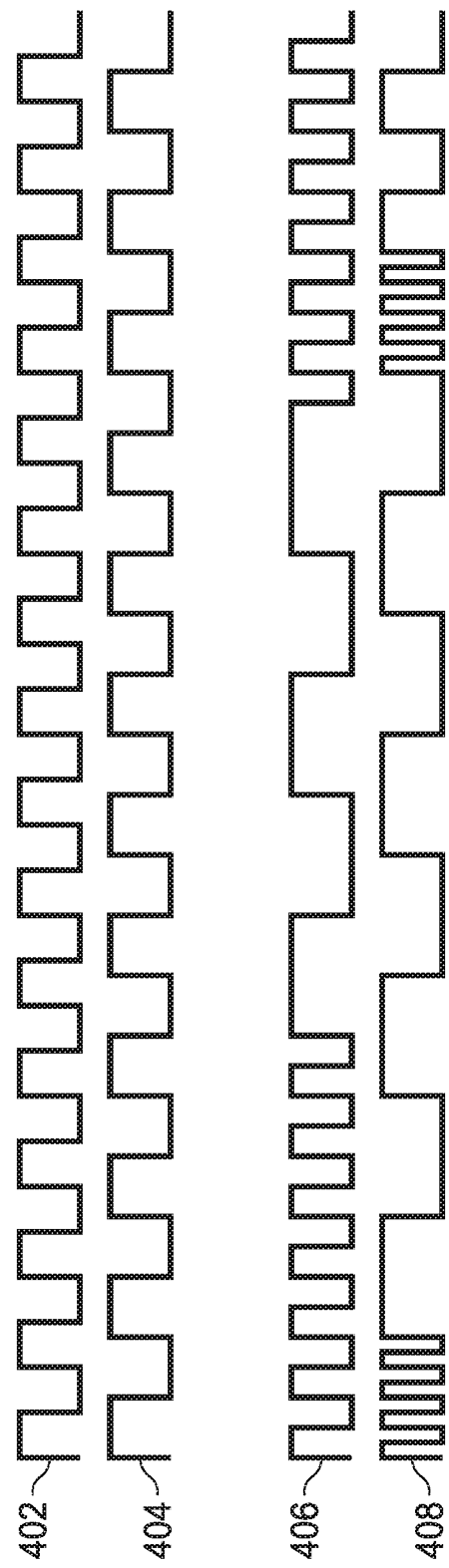
FIG. 4 is an illustration of the operation of a frequency monitoring system in the prior art.

FIG. 4 is an illustration of the operation of a frequency monitoring system in the prior art.

Signal 402 may be a signal driving a reference counter or being counted by a reference counter. Signal 404 may be a signal whose frequency is to be measured by a system counter.

Signal 402 may have a particular frequency, Fref. Fref may be assumed to be accurate or known. The reference counter may count the number of pulses in signal 402 for a designated period of time. The designated period of time may be implied or presumed based upon a certain value of the reference counter and the assumed value of Fref. For example, if Fref is 1 KHz, the reference counter may count one thousand pulses. The time that the reference counter counted may be one second, assuming that Fref is accurate. The count of pulses may be specified as Nref.

While pulses in signal 402 are counted by the reference counter, pulses in signal 404 may be counted by the system counter. When the reference counter finishes counting a specified number of pulses, representing the end of a predetermined time period, an overflow or other signal may be issued. The overflow signal may disable further counting on the system counter so that counting on the system counter also halts. The number of pulses counted by the system counter until the issuance of the overflow signal may be specified as Nsys. The frequency of signal 404 under test may be specified as Fsys. Nsys thus is a proxy for the frequency, Fsys. Fsys may be determined, for example, by Fref times the ratio of Nsys to Nref. In a simpler implementation, the respective counts Nsys and Nref may be compared to simply decide whether or not the frequency of signal 404 is greater or less the frequency of signal 402.

Accurate measurement of the frequency of signal 404 may require a large number of samples. The number of samples and error rate may be inversely related, such that counts may have to be made for 400-500 cycles to achieve a 1% error rate. The longer a measurement is taken, usually the measurement will be more accurate. Furthermore, the assumption that the reference signal is constant and accurate may be incorrect, as element characteristics change over time or with heat. Furthermore, if particular pulses of either signal are longer or shorter, the measurement may be inaccurate, particularly if the frequency changes during the sampling period.

This solution may mistakenly count rising or falling edges that are not present or miss counting rising or falling edges. Thus, clock patterns can be used that fool the mechanisms counting rising or falling edges. A hacker can abuse clock-patterns of various systems. For example, a frequency monitor that requires many hundreds or thousands of cycles of a signal under test may be prone to manipulation. If the signal under test is slow, such as one hertz, the signal driving the reference counter may be slowed by the hacker but then later sped up. At the end of the test, the total number of cycles may be the same, but the cycles during the middle are inconsistent. This is shown in signal 408. A hacker may abuse such a reference signal to, for example, slow the reference signal used on a residential electricity service or power meter during the day when electrical use is more expensive, and then speed up the reference signal later when the electrical use is cheaper. The total number of clock cycles may be the same with or without the manipulation, and if a large number of clock cycles is needed to make an accurate measurement, the manipulation may go undetected. In another example, a signal 406 may be slowed to the point of nearly pausing. Such pausing may be used on a high-speed communications channel so that data being transferred on the channel may be copied or downloaded by a reader after slowing the reference signal down to a slower rate. This may be used, for example, in a credit card skimmer. By the time that the slow-down of the reference signal is detected, upon the completion of many more clock cycles after the reference signal has been returned to a normal rate, the data breach may already be complete. This pausing may represent a forbidden state in which illegal or unauthorized access is made.

Embodiments of the present disclosure, shown above in FIGS. 1-3, may overcome these limitations. A single cycle of input signal 118 may be needed to make a first measurement of the cycle time of input signal 118, and thus the frequency of input signal 118. The more such measurements that are made, wherein the capacitance is adjusted to use a more accurate timing period Δt, the more accurate the frequency measurement. The number of such measurements M may provide an accuracy of M bits, expressed as $\log_2 M$. For example, six clock cycles using SAR binary search may yield an accuracy of 1% error. Furthermore, the implementation of frequency calculation circuit 100 may lead to other accuracy gains. For example, Vbg as-available on many dies or chips may a reference voltage with 2-3% error. However, use of Vbg to both charge capacitor 112 for input to the negative terminal of comparator 106 and to be divided as input to the positive terminal of comparator 106 may mean that the inherent error of Vbg cancels out. In addition, resistive networks for voltage divider 104 may be widely available with very tight error tolerances. Accordingly, input voltage 102 may be divided without introducing much error.

Frequency calculation circuit 100 may have any suitable application. For example, frequency measurements may be made using frequency calculation circuit 100 within any suitable frequency monitoring application. Moreover, frequency calculation circuit 100 may be useful compared to other solutions when a frequency measurement should be made within a narrow window of time or sampled number of cycles. For example, a security system for a communications protocol or service provider may ensure that the system clock maintains its frequency within any given window of 6-20 cycles. That is, if the clock frequency begins to vary, such a variation will be detected within 6-20 cycles of the onset of the variation. In another application, a clock multiplier may utilize poles or zeroes of a clock frequency. The clock multiplier may be used in, for example, a PLL control circuit for wakeup, shut-down, snooze, or other starting and stopping of a clock. The clock multiplier may make use of a determination of the expected clock frequency. However, such a clock multiplier may not have time, given pending PLL operations, to wait 400-500 cycles for determination of a clock frequency. Accordingly, in most implementations of clock multipliers, a user of, or implementer, of a design using clock multipliers may program or hard-code a range of possible clock frequencies for the clock multiplier to use for pole and zero determinations. Embodiments of the present disclosure allow auto-detection of such a clock frequency that may be provided to the clock multiplier. Given the short number of cycles needed to make a frequency determination, auto-detection is technically feasible for clock multipliers. For such an application, nine bits or searches might be used. This may provide not only a low error rate of 1% but be able to provide such a low error rate over many different possible frequencies and frequency ranges, such as 4 Mhz to 48 MHz.

Embodiments of the present disclosure may include a binary search frequency calculator or qualifier which can search the clock frequency of an incoming clock using binary search between 0 and a maximum frequency, using capacitances and time periods as a proxy for the frequency. The search may be conducted to find a value of a capacitor which can be discharged from known voltage to another known voltage within a finite number of cycles of the clock under test. Since initial and final value of voltages and discharge currents are known the value of a time period of the clock from the value of the capacitor can be calculated using EQUATION 1.

Figure 5:
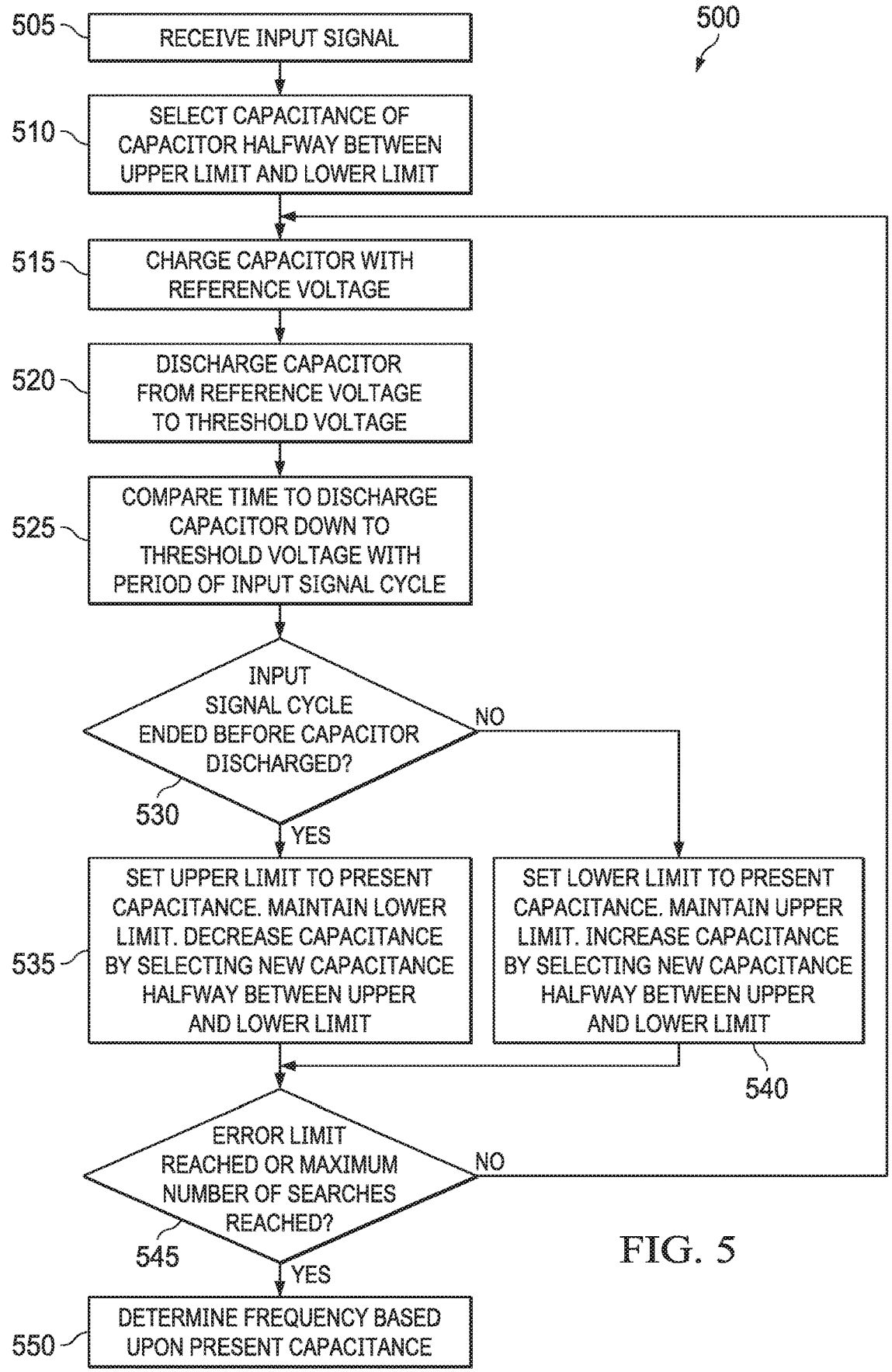
FIG. 5 is an illustration of an example method for performing fast frequency calculation, according to embodiments of the present disclosure.

FIG. 5 is an illustration of an example method 500 for performing fast frequency calculation, according to embodiments of the present disclosure. Method 500 may be performed by any suitable mechanism, such as frequency calculation circuit 100. The steps of method 500 may be performed in any suitable order, and may be initiated at any step, such as step 505. Various steps of method 500 may be repeated, omitted, or performed recursively. Multiple instances of method 500 may be performed in parallel or recursively.

At step 505, an input signal whose frequency is to be measured may be received.

At step 510, an initial capacitance value of a variable capacitor may be selected. A midpoint value of possible capacitance values between an upper limit and a lower limit may be selected. The upper limit may be the maximum capacitance available for the variable capacitor and the lower limit may be the minimum capacitance available for the variable capacitor. If an estimate of a frequency of the input signal is available, the initial capacitance may be set according to a capacitance associated with the initial estimate of the frequency.

At step 515, a capacitor may be charged with a reference voltage.

At step 520, the capacitor may be discharged until a voltage of the capacitor has reached a lower, threshold voltage.

At step 525, the time required to discharge the capacitor down to the threshold voltage may be compared to the period of the input signal cycle.

At step 530, it may be determined whether the input signal cycle ended before the capacitor discharged down to the threshold voltage. If the input signal cycle ended before the capacitor discharged down to the threshold voltage, method 500 may proceed to step 535. Otherwise, method 500 may proceed to step 540.

At step 535, an incremental search step may be performed to select a next capacitance value. The incremental search step may be selected according to any suitable search algorithm. For example, the incremental search step may be selected according to a binary search algorithm. The upper limit of capacitance values may be set to the present capacitance. The lower limit of capacitance values may be maintained at the present lower limit. The capacitance may be decreased to a midpoint capacitance value between the new upper limit and the lower limit. Method 500 may proceed to step 545.

At step 540, an incremental search step may be performed to select a next capacitance value. The incremental search step may be selected according to any suitable search algorithm. For example, the incremental search step may be selected according to a binary search algorithm. The lower limit of capacitance values may be set to the present capacitance. The upper limit of capacitance values may be maintained at the present upper limit. The capacitance may be decreased to a midpoint capacitance value between the new lower limit and the upper limit. Method 500 may proceed to step 545.

At step 545, it may be determined whether a search limit has been reached. The search limit may be defined in any suitable manner. The search limit may be a maximum number of searches or iterations of steps 515-545. The search limit may be an error amount defined by the difference between the time to discharge capacitor down to the threshold voltage and the period of the input signal cycle. If the search limit has been reached, method 500 may proceed to step 550. If the search limit has not been reached, method 500 may return to step 515.

At 550, the final value of the capacitance may be used to determine the frequency of the input signal. The frequency may be obtained by, for example, a look-up table or by performing a calculation between the value of the capacitance and the frequency as discussed above in EQUATION 1.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. An apparatus, comprising:
a capacitor;
a reference voltage selectively communicatively coupled to the capacitor by a first switch;
an input signal; and
a frequency calculation circuit communicatively coupled to the capacitor, the first switch, and the input signal, and configured to:
select a capacitance value for the capacitor;
charge the capacitor with the reference voltage by at least operating the first switch;
discharge the capacitor to a threshold voltage by at least further operating the first switch; and
based on a comparison of time to discharge the capacitor to the threshold voltage with a clock cycle of the input signal, determine a frequency of the input signal.

2. The apparatus of claim 1, wherein the frequency calculation circuit is further configured to select a subsequent capacitance value for the capacitor based upon the comparison of time to discharge the capacitor with the clock cycle of the input signal.

3. The apparatus of claim 2, wherein the frequency calculation circuit is further configured to:
charge the capacitor with the reference voltage after setting the capacitor with the subsequent capacitance value;
discharge the capacitor to the threshold voltage after setting the capacitor with the subsequent capacitance value; and
determine the frequency of the input signal further based on a comparison of the clock cycle of the input signal with time to discharge the capacitor to the threshold voltage after setting the capacitor with the subsequent capacitance value.

4. The apparatus of claim 1, wherein the frequency calculation circuit is further configured to, until a search threshold is reached:
iteratively select and set subsequent capacitance values for the capacitor based upon a previous comparison of time to discharge the capacitor with the clock cycle of the input signal;
charge and discharge the capacitor after each capacitance value is iteratively selected and set for the capacitor; and
compare the clock cycle of the input signal with a given time to discharge the capacitor to the threshold voltage given a subsequent capacitance value.

5. The apparatus of claim 4, wherein the frequency calculation circuit is configured to perform a binary search to iteratively select and set subsequent capacitance values.

6. The apparatus of claim 4, wherein the frequency calculation circuit is further configured to determine the frequency of the input signal further based on the comparisons of the clock cycle of the input signal with the given times to discharge the capacitor to the threshold voltage given the subsequent capacitance values.

7. The apparatus of claim 1, further comprising a comparison circuit communicatively coupled to the frequency calculation circuit, the voltage source, and the capacitor, and configured to:

determine discharge of the capacitor to the threshold voltage by a comparison of an instant voltage of the capacitor while discharging with a divided voltage of the reference voltage; and provide the discharge of the capacitor to the frequency calculation circuit.

8. The apparatus of claim 1, wherein the frequency calculation circuit is implemented as a successive approximation register.

9. The apparatus of claim 1, wherein the capacitor is a variable capacitor and the frequency calculation circuit is configured to set the capacitance of the variable capacitor.

10. The apparatus of claim 1, wherein the determination of the frequency of the input signal is based upon an association of the time to discharge the capacitor to the threshold voltage with the capacitance value for the capacitor.

11. The apparatus of claim 1, wherein the frequency calculation circuit is further configured to determine the frequency of the input signal based on an inverse of time to discharge the capacitor to the threshold voltage.

12. A method, comprising:
selecting a capacitance value for a capacitor;
charging the capacitor with a reference voltage;
discharging the capacitor to a threshold voltage; and
based on a comparison of time to discharge the capacitor to the threshold voltage with a clock cycle of an input signal, determine a frequency of the input signal.

13. The method of claim 12, further comprising selecting a subsequent capacitance value for the capacitor based upon the comparison of time to discharge the capacitor with the clock cycle of the input signal.

14. The method of claim 13, further comprising
charging the capacitor with the reference voltage after setting the capacitor with the subsequent capacitance value;
discharging the capacitor to the threshold voltage after setting the capacitor with the subsequent capacitance value; and
determining the frequency of the input signal further based on a comparison of the clock cycle of the input signal with time to discharge the capacitor to the threshold voltage after setting the capacitor with the subsequent capacitance value.

15. The method of claim 12, further comprising, until a search threshold is reached:
iteratively selecting and setting subsequent capacitance values for the capacitor based upon a previous comparison of time to discharge the capacitor with the clock cycle of the input signal;
charging and discharging the capacitor after each capacitance value is iteratively selected and set for the capacitor; and comparing the clock cycle of the input signal with a given time to discharge the capacitor to the threshold voltage given a subsequent capacitance value.

16. The method of claim 15, further comprising performing a binary search to iteratively select and set subsequent capacitance values.

17. The method of claim 16, further comprising determining the frequency of the input signal further based on the comparisons of the clock cycle of the input signal with the given times to discharge the capacitor to the threshold voltage given the subsequent capacitance values.

18. The method of claim 12, further comprising determining discharge of the capacitor to the threshold voltage by a comparison of an instant voltage of the capacitor while discharging with a divided voltage of the reference voltage.

19. The method of claim 12, wherein the determination of the frequency of the input signal is based upon an association of the time to discharge the capacitor to the threshold voltage with the capacitance value for the capacitor.

20. An integrated circuit device, comprising:
a variable capacitor;
a reference voltage selectively communicatively coupled to the capacitor by a first switch;
an input signal; and
a frequency calculation circuit communicatively coupled to the capacitor, the first switch, and the input signal, and configured to:
select a first capacitance value for the variable capacitor;
charge the variable capacitor with the reference voltage by at least operating the first switch;
discharge the variable capacitor to a threshold voltage by at least further operating the first switch;
compare completion of discharging the variable capacitor to the threshold voltage with completion of a clock cycle of the input signal;
based on a determination that the variable capacitor completed discharging to the threshold voltage finished before completion of the clock cycle of the input signal, selecting a second capacitance value of the variable capacitor, wherein the second capacitance value of the variable capacitor is higher than the first capacitance value;
based on a determination that the variable capacitor completed discharging to the threshold voltage finished after completion of the clock cycle of the input signal, selecting a second capacitance value of the variable capacitor, wherein the second capacitance value of the variable capacitor is lower than the first capacitance value; and
determining a frequency of the input signal based upon the second capacitance value.

* * * * *